(12) United States Patent
Zhang et al.

(10) Patent No.: US 7,477,441 B1
(45) Date of Patent: Jan. 13, 2009

(54) MEMS DEVICE WITH NANOWIRE STANDOFF LAYER

(75) Inventors: Wenhua Zhang, Sunnyvale, CA (US);
Wei Wu, Mountain View, CA (US);
Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 11/881,076

(22) Filed: Jul. 24, 2007

(51) Int. Cl.
*G02B 26/00* (2006.01)
*G02B 26/08* (2006.01)

(52) U.S. Cl. ..................... 359/290; 359/198

(58) Field of Classification Search ................ 359/198, 359/212, 223, 224, 290–292, 298
See application file for complete search history.

(56) References Cited

U.S. PATENT DOCUMENTS

| | | | |
|---|---|---|---|
| 5,583,688 | A | 12/1996 | Hornbeck |
| 6,859,577 | B2 | 2/2005 | Lin |
| 6,917,459 | B2 | 7/2005 | Nikkel et al. |
| 7,009,745 | B2 | 3/2006 | Miller et al. |
| 7,079,301 | B2 | 7/2006 | Monroe et al. |
| 7,226,802 | B2 | 6/2007 | Ocansey et al. |
| 2002/0079550 | A1 | 6/2002 | Daneman et al. |
| 2003/0161949 | A1 | 8/2003 | Ashurst et al. |
| 2006/0292846 | A1 | 12/2006 | Pinto et al. |
| 2007/0105356 | A1 | 5/2007 | Wu et al. |
| 2008/0187154 | A1* | 8/2008 | Martin .................. 381/174 |

OTHER PUBLICATIONS

Gjerde, K., et. al., "Carbon Nanotube Forests: A Non-Stick Workbench for Nanomanipulation," Nanotechnology 17, Inst. of Physics Pub. Ltd., UK, pp. 4917-4922 (2006).
Hofmann, S., et. al., "Gold Catalyzed Growth of Silicon Nanowires by Plasma Enhanced Chemical Vapor Deposition," Jrnl. Applied Physics, vol. 1, No. 9, pp. 6005-6012 (Nov. 2003).
Miyoshi, K., et. al., "Solid Lubrication by Multiwalled Carbon Nanotubes in Air and in Vacuum," Tribology Letters, vol. 19, No. 3, pp. 191-201 (Jul. 2005).
R&T Presentation, "New Effective Material Couple—Oxide Ceramic and Carbon Nanotube—Dev. for Aerospace Microsystem and Micromachine Tech." http://www.grc.nasa.gov/WWW/RT/2003.

* cited by examiner

*Primary Examiner*—William C Choi (57) ABSTRACT

A microelectromechanical systems (MEMS) device and related methods are described. The MEMS device comprises a first member having a first surface and a second member having a second surface, the first and second surfaces being separated by a gap that is closable by a MEMS actuation force applied to at least one of the first and second members. A standoff layer is disposed on the first surface of the first member, the standoff layer providing standoff between the first and second surfaces upon a closing of the gap by the MEMS actuation force. The standoff layer comprises a plurality of nanowires that are anchored to the first surface of the first member and that extend outward therefrom.

20 Claims, 4 Drawing Sheets

MEMS DEVICE WITH NANOWIRE STANDOFF LAYER

FIELD

This patent specification relates to microelectromechanical systems (MEMS) devices. More particularly, this patent specification relates to standoff structures in MEMS devices.

BACKGROUND

Advances in microelectromechanical systems (MEMS) technology continues to increase the applicability of MEMS devices to a variety of technological endeavors. By way of example, MEMS integrated circuit devices can be found in inkjet printers, automobile airbag systems, automobile stability control systems, optical switches, pressure sensors, computer and television display systems, and optical switches. Further applications for MEMS devices continue to be developed. As used herein, MEMS device refers generally to a micro-scale or nano-scale apparatus having two or more parts adapted to move relative to one another, where the motion is based on any suitable interaction or combination of interactions, such as mechanical, thermal, electrical, magnetic, optical, and/or chemical interactions. MEMS devices include, without limitation, NEMS (nanoelectromechanical systems) devices, MOEMS (micro-opto-electromechanical systems) devices, and devices with analogous functionalities having alternative nomenclatures as may be currently or hereinafter used or adopted.

The operation of many MEMS devices involves actuation that closes a gap between two members such that their surfaces are brought into actual or imminent contact with each other. By way of example, a simple MEMS-based optical switch may comprise a cantilevered mirror element disposed above a substrate layer, such that a voltage applied between the mirror element and the substrate layer causes flexing of the mirror element toward the substrate by electrostatic attraction, whereby a light beam impinging upon the mirror element is redirected according to the applied voltage. In another example, large arrays of such mirror elements can be placed on a single chip and individually driven by separate voltages to form a DMD (deformable mirror device) for use in a computer or television display system.

Moveable MEMS elements, such as the above-described cantilevered mirror element, often have high surface area to volume ratios such that surface effects can become competitive with mass, inertia, and the various "intentional" forces in dictating the actual movement (or lack thereof that physically occurs. So-called stiction forces, for example, can cause a mirror element to stick to a substrate and prevent the mirror element from moving. Various mechanisms have been proposed to explain such adhesion, including solid bridging, liquid bridging, "cold welding," Van der Waals forces, and hydrogen bonding. Often the stuck part can be separated with increased force, but sometimes a permanent bond is formed after the initial contact. In addition to degrading device performance or causing outright device failure, stiction issues can also underlie increased margin requirements in device design (e.g., building in a higher spring coefficient for a deformable member, increasing actuation/release voltages, etc.) which can increase device size, cost, and power requirements, while reducing device speed and efficiency. Other issues arise as would be apparent to one skilled in the art in view of the present disclosure.

SUMMARY

In one embodiment, a MEMS device is provided, comprising a first member having a first surface and a second member having a second surface, the first and second surfaces being separated by a gap that is closable by a MEMS actuation force applied to at least one of the first and second members. A standoff layer is disposed on the first surface of the first member, the standoff layer providing standoff between the first and second surfaces upon a closing of the gap by the MEMS actuation force. The standoff layer comprises a plurality of nanowires that are anchored to the first surface and that extend outward therefrom.

Also provided is a method of fabricating a MEMS device. The method comprises forming a first member having a first surface and a second member having a second surface. The first and second surfaces are separated by a gap that is closable by a MEMS actuation force applied to at least one of the first and second members. The method further comprises growing a plurality of nanowires anchored to the first surface and growing outward therefrom. The plurality of nanowires forms a standoff layer that provides standoff between the first and second surfaces upon a closing of the gap by the MEMS actuation force.

Also provided is a method comprising operating a MEMS device to cause a mechanical closing of a gap between a first surface of a first member of the MEMS device and a second surface of a second member of the MEMS device. The first surface comprises a plurality of nanowires anchored thereto and extending outward therefrom to form a standoff layer that provides standoff between the first and second surfaces upon the closing of the gap.

DETAILED DESCRIPTION

Figure 1A:
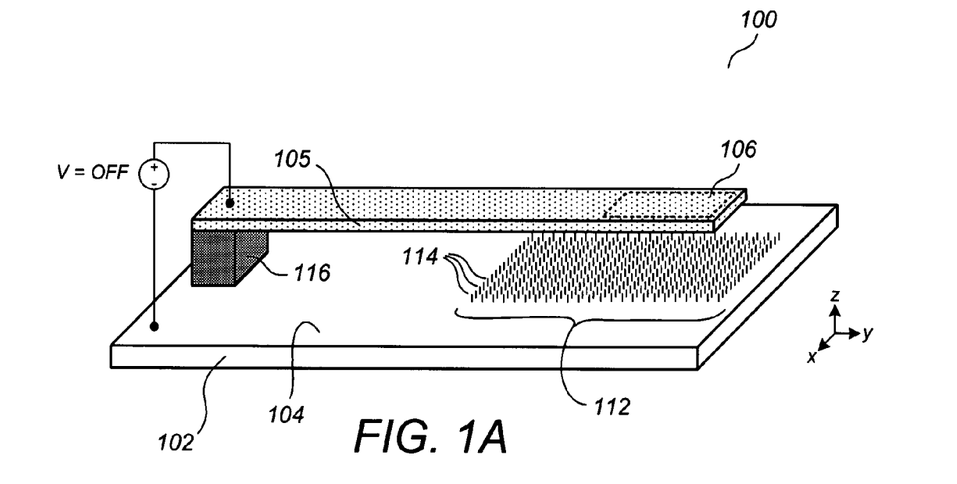
FIGS. 1A-1B illustrate perspective views of a MEMS device according to an embodiment.
Figure 1B:
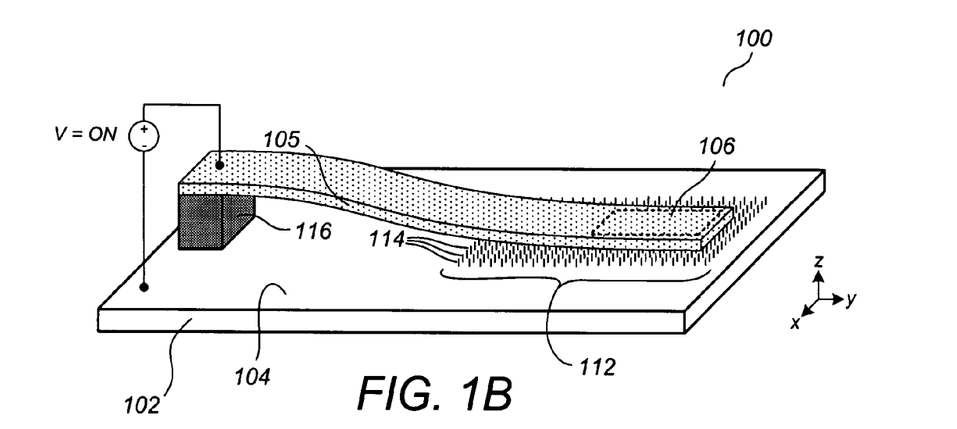
Figure 1C:
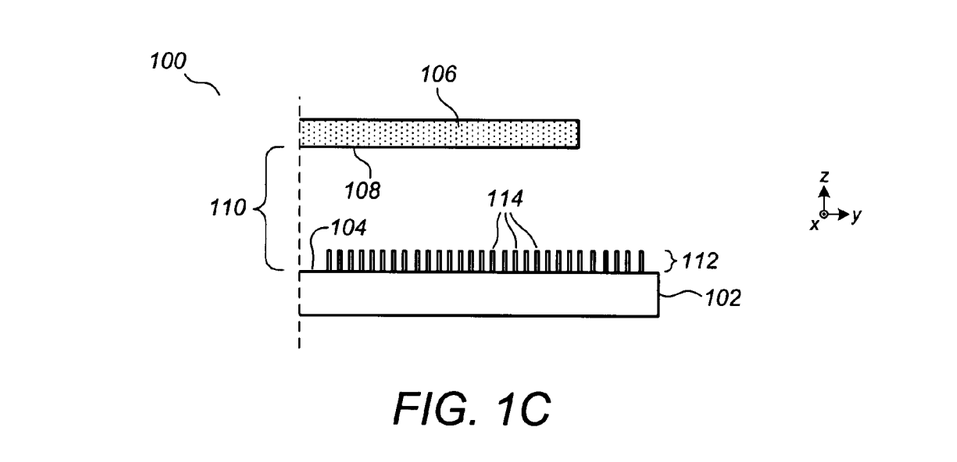
FIG. 1C illustrates a side view of the MEMS device of FIGS. 1A-1B.

FIGS. 1A-1B illustrate perspective views of a MEMS device 100 according to an embodiment, with FIG. 1A illustrating an open-gap configuration and FIG. 1B illustrating a closed-gap configuration. FIG. 1C illustrates a side view of the MEMS device 100 in the open-gap configuration. MEMS device 100 comprises a lower member 102 having a first surface 104, and an upper member 106 having a second surface 108. The upper member 106 forms part of a larger cantilever mirror element 105 that is spaced apart from the lower member 102 by a spacer element 116 at one end. In the open configuration, there is a gap 110 between the second surface 108 and the first surface 104. The MEMS device 100 preferably comprises materials and structures compatible with CMOS (complementary metal-oxide-semiconductor) fabrication technologies, which are well known and around which large bases of installed fabrication equipment has been built up worldwide. For higher-power applications, the MEMS device 100 can comprise materials and structures compatible with bipolar and/or BiCMOS (an integration of bipolar and CMOS) fabrication technologies.

It is to be appreciated that the relative simple MEMS device 100 is presented for clarity of description. There are many other types of MEMS structures for which one or more of the embodiments is applicable. Likewise, real-world MEMS structure implementations incorporating one or more of the embodiments will invariably have substantially more layers and elements than illustrated in FIGS. 1A-1C and the other drawings herein. For example, although in one embodiment (i) the lower member 102 is part of a substrate layer upon which a remainder of the MEMS structure is built and (ii) cantilever mirror element 105 is in an uppermost surface, in other embodiments the lower member 102 and cantilever mirror element 105 are formed in intermediate layers among tens or even hundreds of other layers in the overall MEMS device. Also for clarity of description, only a portion of the cantilever mirror element 105, termed the upper member 106, is described in further detail, as there are many different actuation mechanisms for causing movement of the upper member 106 other than cantilever-style elements that are within the scope of the present teachings.

It is to be appreciated that many different mechanisms can be used to actuate the upper member 106 relative to the lower member 102. It is to be further appreciated that as used herein, MEMS actuation force applied to a member refers to any MEMS-based cause of motion for that member, including direct actuation (for example, an electrostatic force directly being exerted on the member by application of a voltage) and indirect actuation (for example, the member is mechanically coupled to a different MEMS-moveable element that is being actuated).

It is to be further appreciated that, for clarity of description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the embodiments can be positioned in a number of different orientations, the directional terminology is used for purposes of illustration and is in no way limiting.

The gap 110 is closable by a MEMS actuation force applied to at least one of the lower member 102 and the upper member 106. In the simplified example of FIGS. 1A-1C, a voltage "V" between the lower member 102 and the cantilever element 105 is applied by other circuitry in the MEMS device 100 (not shown). When the voltage is "ON" (see FIG. 1B), the cantilever element 105 is flexed downward toward the lower member 102 by electrostatic force, which in turn forces the upper member 106 to move toward the lower member 102 toward a closed-gap position. For many implementations, the gap 110 will usually be about 1 micron, although the scope of the embodiments is not so limited. The lower member 102 may comprise, for example, crystalline Si, while the upper member 106 may comprise a reflective metal. In other embodiments, the upper member 106 may comprise crystalline Si having a reflective layer (not shown) coated on its upward-facing surface.

MEMS device 100 further comprises a standoff layer 112 disposed on the first surface 104 of the lower member 102, the standoff layer 112 comprising a plurality of nanowires 114 anchored to the first surface 104 and extending upwardly (outwardly) therefrom. Standoff generally refers to a condition and/or functionality whereby two surfaces that are otherwise being forced together into contact are held back from actual contact which, in the case of the present teachings, is provided by an outward or repelling force provided by physical contact of the nanowires 114, primarily at their tips, with the respective surfaces. The first and second surfaces 102/106 would touch but for the presence of the standoff layer 112. Advantageously, depending on their spatial density, materials, and dimensions, the nanowires 114 will bend somewhat as the standoff force is provided, thereby providing a degree of springability to the standoff characteristic. Among other advantages, stiction problems that could otherwise prevent the release of the upper member 106 from the lower member 102 are at least partially overcome by virtue of the standoff functionality provided by the nanowires 114 of the standoff layer 112.

Nanowires 114 preferably comprise material that can be catalytically grown outward from the first surface 104. The particular selection of nanowire material will be influenced by the nature of the material of the lower member 102 at the first surface 104. In one embodiment, the lower member 102 comprises crystalline or polycrystalline Si at the first surface 104 (or amorphous Si having sufficient short-term crystalline signature for nanowire growth), and the nanowires 114 also comprise Si. More generally, the materials for lower member 102 at the first surface 104 and the nanowires 114 can be selected from a variety of nanowire growth-amenable combinations, as would be identifiable by a person skilled in the art, selected from a group comprising Group IV materials (e.g., Si, Ge, SiC), Group III-V materials (e.g., GaN, GaP, InP, InAs, AlN), and Group II-VI materials (e.g., ZnO, CdS). For clarity of description and not by way of limitation, a particularly useful implementation in which silicon is used as both the substrate and nanowire material is presented further herein.

In one embodiment, the nanowires 114 have lengths between about percent and 50 percent of the gap distance 110 which, for the case of a 1 μm gap, are lengths between about 50 nm and 500 nm. In other embodiments, the nanowires 114 can be shorter than 50 nm or longer than 500 nm, and the lengths of the nanowires can vary spatially within one MEMS cell or spatially across different MEMS cells. The length of the nanowires 114 can even approach 100 percent of the gap distance without departing from the scope of the present teachings. In one embodiment, the nanowires 114 have diameters in the range of 10 nm-200 nm, although the scope of the present teachings is not so limited. A large range of nanowire population densities are within the scope of the present teachings, ranging from thousands (or fewer) of nanowires per square centimeter to millions (or more) of nanowires per square centimeter.

In one embodiment, the nanowires 114 are anchored to the surface 104 by virtue of having been catalytically grown therefrom and being structurally integral therewith. In distinction to sprinkled coatings of unanchored nanowires on the approaching surfaces, many of which would simply take on an orientation parallel to the approaching surfaces, anchoring of the nanowires facilitates springability of the standoff functionality. The anchoring of the nanowires 114 also inhibits them from loosely floating about the MEMS device 100, which would be especially problematic if they were electrically conducting, in which case various electrical components/connections of the MEMS device could become shorted by the loosely floating nanowires.

For one embodiment, the nanowires 114 comprise a material that is substantially nonconducting at a nominal operating voltage of the MEMS device, such that they effectively act as insulator materials. SiC or other high-bandgap dielectric materials will often be suitable for many practical implementations. Advantageously, in the event of breakage from their anchored position and movement about the MEMS device, various electrical components/connections of the MEMS device would not become shorted by the insulative nanowires. However, the scope of the present teachings is not so limited, and in other embodiments the nanowires 114 can comprise conductive materials.

For the embodiment of FIGS. 1A-1C, the nanowires 114 are regularly spaced on the first surface 104 according to a predetermined pattern, which can be achieved by patterning the first surface 104 with islands of catalyst metal such as titanium or gold prior to growing the nanowires, as described further infra. For the embodiment of FIGS. 1A-1C, the nanowires 114 extend upward (outward) from the first surface 104 at a vertical (normal) angle. For Si nanowires growing out of crystalline Si, this can be achieved by ensuring that the lower member 102 consists of <111> Si at the first surface 104. In other embodiments, the nanowires 114 may extend upward at a uniform off-vertical angle, as may be achieved, for example, using other crystalline orientations, various surface-tilting strategies during fabrication, or other methods known in the art.

Figure 2:
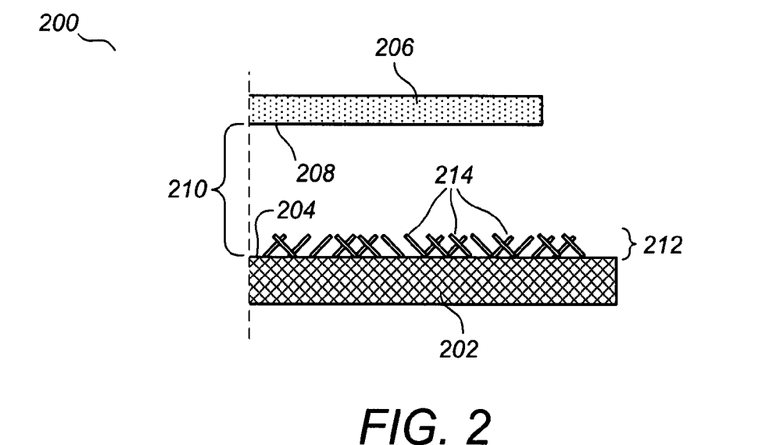
FIG. 2 illustrates a side view of a MEMS device according to an embodiment.

FIG. 2 illustrates a side view of a MEMS device 200 according to an embodiment, comprising a lower member 202 having a first surface 204 separated by a gap 210 from a second surface 208 on an upper member 206, and further comprising a standoff layer 212 formed by a plurality of nanowires 214 anchored to the lower member 202 at the first surface 204. As illustrated in FIG. 2, each of said nanowires 214 extends outward from the first surface 204 at one of a small number of predetermined angles nonparallel to the first surface 204. The regular angular orientation of nanowires can be beneficial over purely vertical nanowires for reasons including more predictable springability functionality. As would be known to a person skilled in the art, the angular growth of the nanowires can be achieved by using a crystalline lower member 202 with judicious selection of crystal directions at the surface 204. By way of example, for Si nanowires growing out of crystalline Si, each nanowire will grow at one of three predetermined possible orientations if the lower member 202 comprises <100> Si at the first surface 204.

Figure 3:
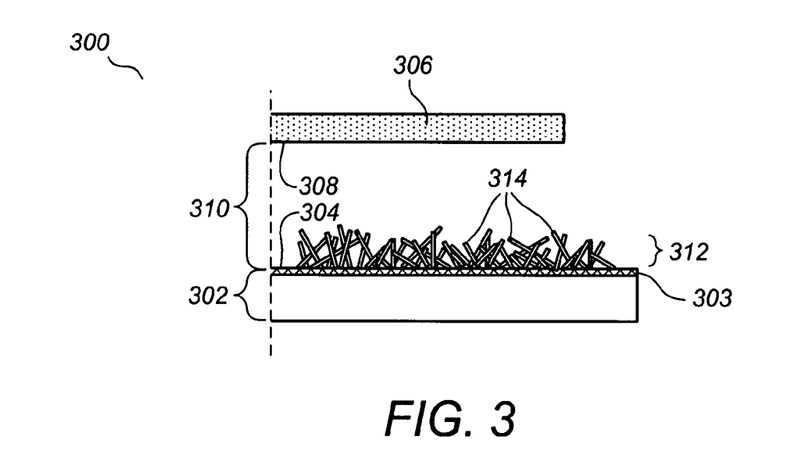
FIG. 3 illustrates a side view of a MEMS device according to an embodiment.

FIG. 3 illustrates a side view of a MEMS device 300 according to an embodiment, comprising a lower member 302 that includes a polycrystalline layer 303 that can be relatively thin (e.g., 100 nm), the lower member 302 having a first surface 304 at the top of the polycrystalline layer 303. The first surface 304 is separated by a gap 310 from a second surface 308 on an upper member 306, and the MEMS device 300 further comprises a standoff layer 312 formed by a plurality of nanowires 314 anchored to the lower member 302 at the first surface 304. As illustrated in FIG. 3, the nanowires 314 are disposed across the first surface 304 in a random spatial pattern and extend outward from the first surface 304 at random angles substantially nonparallel to the first surface 304. The spatial randomness of the nanowires 314 can be advantageous over regular spacing for reasons including ease of fabrication.

The angular randomness of the nanowires 314 is facilitated by the polycrystalline layer 303 (such as polycrystalline Si), which provides short-term crystal signatures that are usually sufficient for nanowire growth. In another embodiment, the layer 303 can instead comprise certain kinds of amorphous Si having sufficient short-term crystalline signatures for nanowire growth. The angular randomness of the nanowires 314 can be advantageous over specified, predetermined angles for reasons including one or more of (i) a "flatter" springability response, (ii) an ability to statistically tailoring a springability response, (iii) avoidance of stiction problems that could be associated with short-term or long-term regularities or uniformities in the interactions between the nanowire tips and the approaching surface during MEMS actuation, or (iv) for other reasons.

Figure 4:
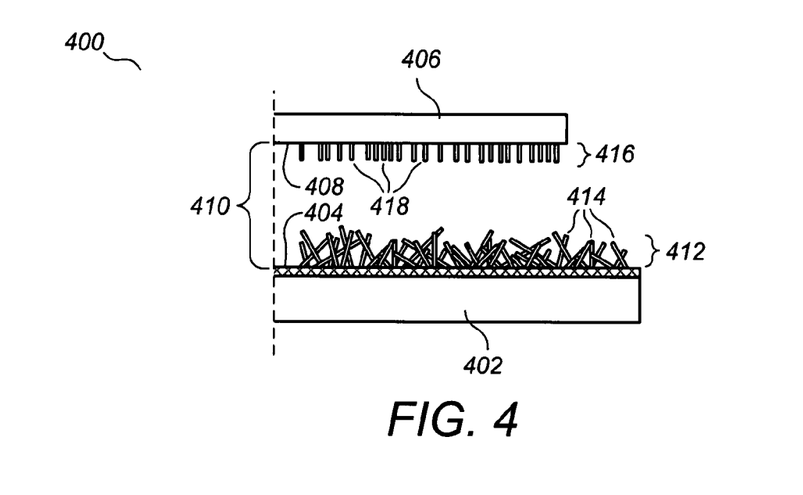
FIG. 4 illustrates a side view of a MEMS device according to an embodiment.

FIG. 4 illustrates a side view of a MEMS device 400 according to an embodiment, comprising a lower member 402 that includes a polycrystalline layer 403, the lower member 402 having a first surface 404 at the top of the polycrystalline layer 403. The first surface 404 is separated by a gap 410 from a second surface 408 on an upper member 406. The MEMS device 400 further comprises a first standoff layer 412 formed by a first plurality of nanowires 414 anchored to first surface 404 at random locations and extending upward therefrom at random angles.

For further increasing standoff functionality according to an embodiment, the MEMS device 400 further comprises a second standoff layer 416 formed by a second plurality of nanowires 418 anchored to the upper member 406 at the second surface 408 and extending downward therefrom. Ranges of diameter, length, and density for the second plurality of nanowires 418 may be similar, to or different than, those for the first plurality of nanowires 414 without departing from the scope of the present teachings. Fabrication of the second plurality of nanowires 418 can be formed in a same fabrication step using a same colloidal suspension of metallic catalytic nanoparticles as described infra with respect to FIG. 7. For the particular example of FIG. 4, the upper member comprises <111> Si at the second surface 408 such that the nanowires 418, although being randomly placed, extend downward at a vertical (normal) angle from the second surface 408.

Figure 5:
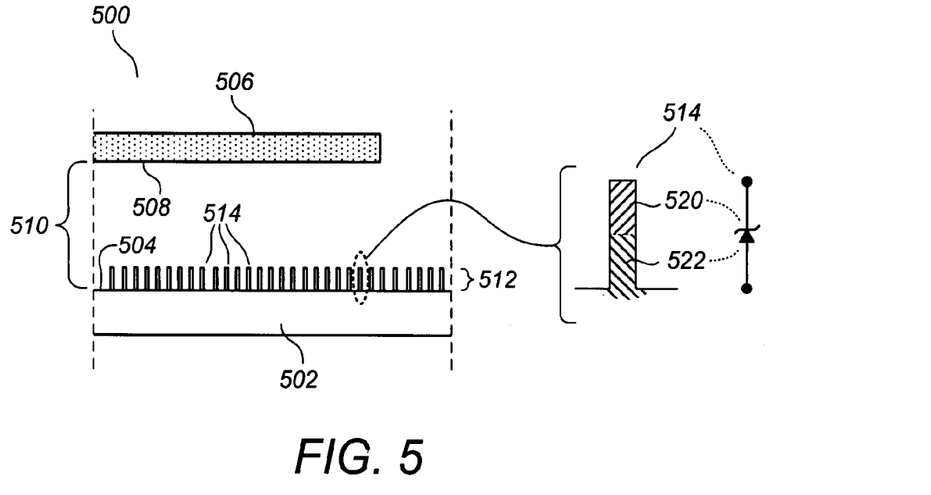
FIG. 5 illustrates a side view of a MEMS device according to an embodiment.

FIG. 5 illustrates a side view of a MEMS device 500 according to an embodiment, comprising a lower member 502 having a first surface 504 separated by a gap 510 from a second surface 508 on an upper member 506, and further comprising a standoff layer 512 formed by a plurality of nanowires 514 anchored to the lower member 502 at the first surface 504. According to an embodiment, for each nanowire 514, a first type of dopant (p-type, e.g., boron) is added to the gasses during a first phase of the catalytic growth process to create a p-type semiconductor portion 522, whereas a second type of dopant (n-type, e.g., phosphorus) is added to the gasses during a second phase to create an n-type semiconductor portion 520. Accordingly, each nanowire 514 can also be functional as a semiconductor heterojunction diode, which can be used for various advantageous purposes.

By way of example, in one of many possible scenarios, the first and second members 502/506 may be conductive members across which a voltage (having a positive polarity at the second member 506) is applied to result in an electrostatic attraction. If that voltage is increased beyond a certain tolerable level, the attraction force may be too great and various components (for example, a cantilever element to which the upper member 506 may be connected) may be irreparably damaged. To avoid this event, the nanowire/diode 514 (along with a similar population of nanowires/diodes) can be configured as a zener diode, as illustrated by a zener diode symbol in FIG. 5. The nanowire/zener diode 514 can be designed to enter avalanche breakdown mode when the voltage gets too high, thereby protecting the device from damage. Advantageously, the nanowire/zener diode 514 would otherwise not disturb the operation of the device, acting simply as a reverse-biased diode for voltages below the avalanche breakdown threshold.

Figure 6:
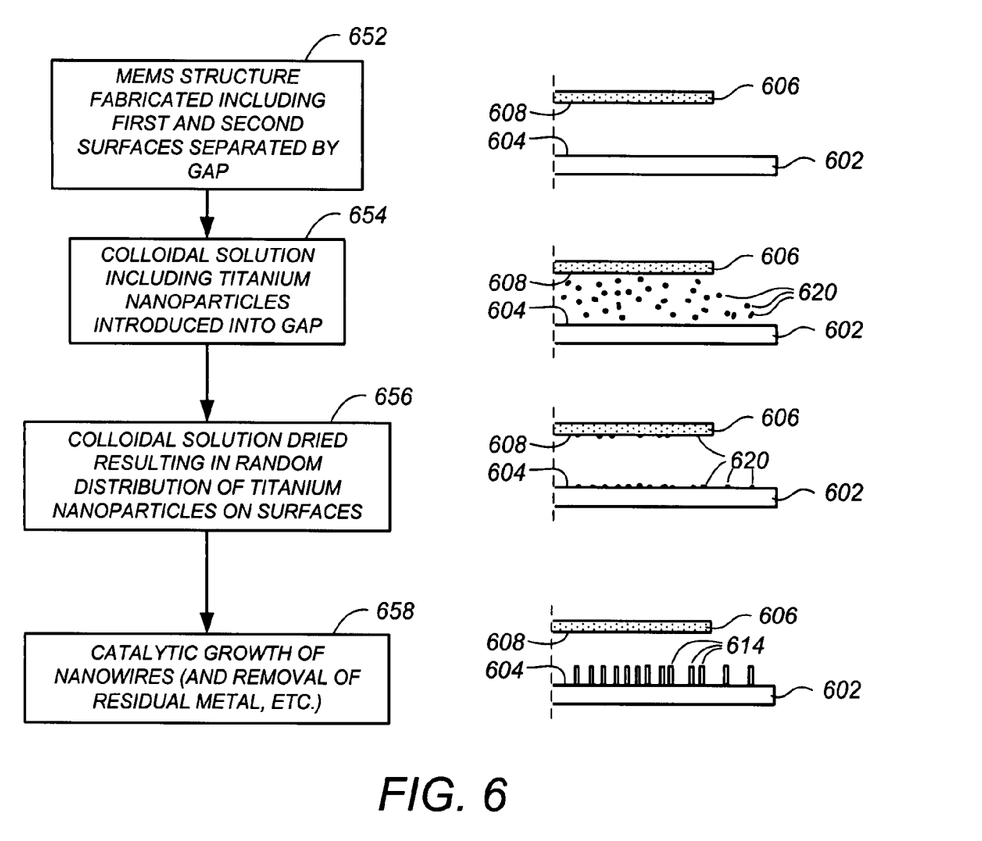
FIG. 6 illustrates fabricating a MEMS device according to an embodiment.

FIG. 6 illustrates fabricating a MEMS device according to an embodiment in which only random patterns of standoff nanowires are needed. At step 652, the basic MEMS structure is formed using known methods, the MEMS structure comprising a lower member 602 having a first surface 604 separated by a gap 610 from a second surface 608 of an upper member 606. At step 654, subsequent to the forming of the first and second members 602/606 including the gap 610, the gap 610 is filled with a colloidal solution containing metallic nanoparticles 620. For nanowires, the metallic nanoparticles 620 can comprise titanium or gold. The metallic nanoparticles 620 should be sized according to the desired diameter of the nanowires. At step 656, the colloidal solution is dried, whereupon some of the metallic nanoparticles 620 remain on the first surface 604 at random locations, and whereupon others of the metallic nanoparticles 620 remain on the second surface 608 at random locations. At step 658, nanowires 614 are catalytically grown from the first surface 604 of the lower member 602 (and residue metal is removed, etc.).

In the particular example of FIG. 6, the upper member 606 comprises a metallic hinge material at the second surface 608 and, therefore, no nanowires are grown therefrom at step 658. In an alternative embodiment in which upper member 606 comprises a crystalline material at the second surface 608, nanowires can also grow therefrom in a downward direction at step 658. In the particular example of FIG. 6, <111> Si is used for the lower member 602 at the first surface 604, and therefore the nanowires 614 grow vertically therefrom. In accordance with principles described supra, random nanowire orientations can be achieved by having polycrystalline Si at the first surface 604, while predetermined angular orientations can be achieved by having <100> Si at the first surface 604.

Figure 7:
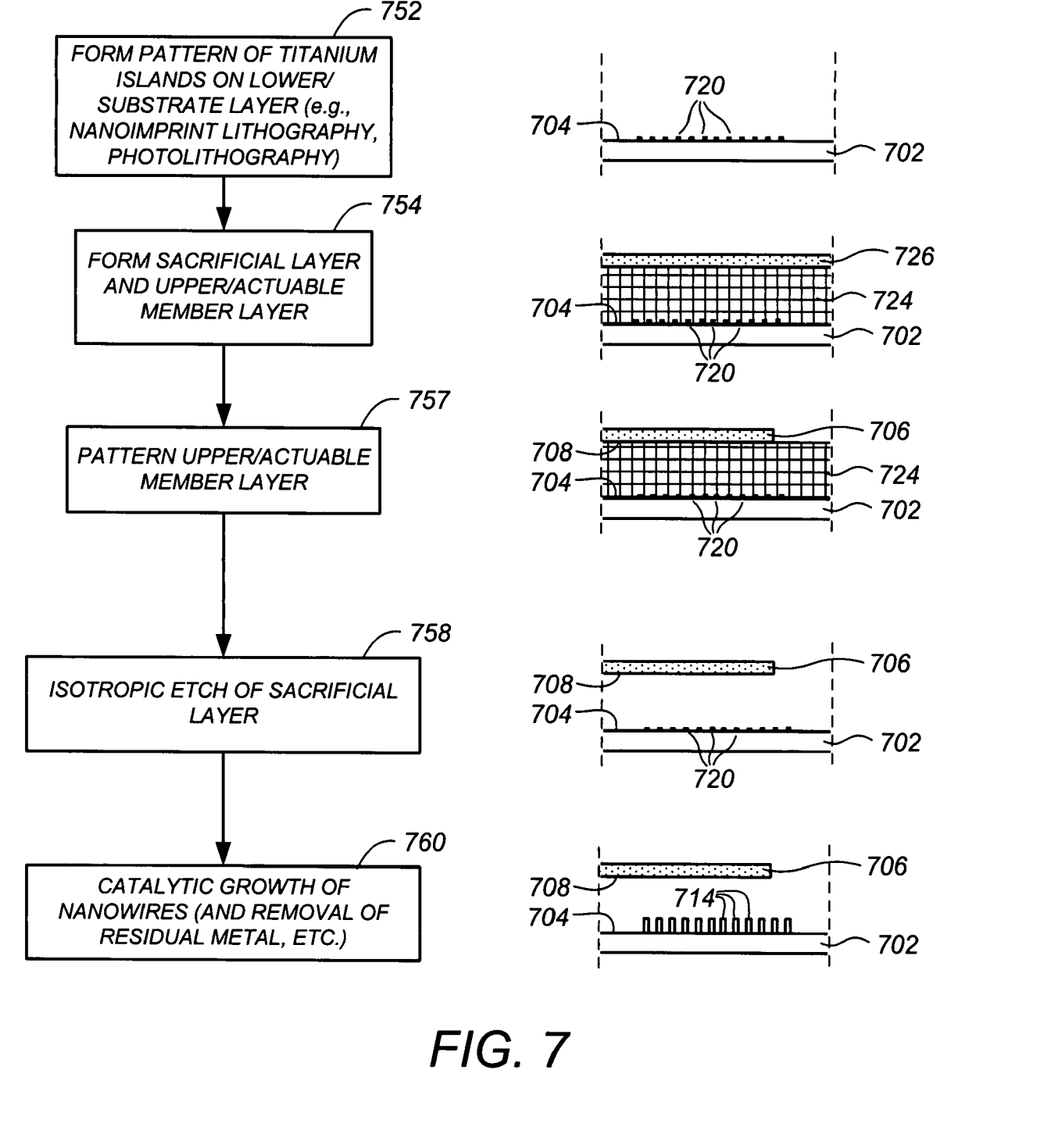
FIG. 7 illustrates fabricating a MEMS device according to an embodiment.

FIG. 7 illustrates fabricating a MEMS device according to an embodiment in which standoff nanowires according to a predetermined spatial pattern are desired. At step 752, the lower member 702 is formed and islands 720 of metallic catalytic growth material such as titanium are formed thereon according to a predetermined pattern. The patterning can be achieved using any of a variety of known methods based on nanoimprint lithography, photolithography, electron beam lithography, etc. In many cases the metallic islands will extend about 5-10 nm above a first surface 704 of the lower member 702. At step 754, a sacrificial layer 724 is formed atop the first surface 704 as well as atop the metallic islands 720, and an upper layer 726 comprising the intended material for the upper member is formed. At step 757, the upper member 706 is patterned from the upper layer 726 in a manner that exposes at least a portion of the sacrificial layer 724. At step 758 an isotropic etch is performed to remove the sacrificial layer 724 while keeping the upper member 706, lower member 702, and metallic islands 720 intact. At step 760, nanowires 714 are catalytically grown from the first surface 704 of the lower member 702 (and residue metal is removed, etc.) in a manner similar to that described supra with respect to step 658 of FIG. 6.

It is to be appreciated that practical fabrication processes for a MEMS device according to one or more of the embodiments will typically involve many prior preparation steps, sub-steps, and post-processing steps with respect to the steps of the above-described fabrication methods. However, one skilled in the art of MEMS fabrication, CMOS processing, and related arts would be readily able to fabricate a MEMS device according to one or more of the embodiments without undue experimentation in view of the present disclosure.

In one or more embodiments, the standoff nanowires can be considered as forming a grass-like, forest-like, artificial turf-like, or felt-like structure that facilitates release of MEMS-actuated surfaces that might otherwise stick when the gap between them closes. Although the specific mechanisms at work may be different, the effect can analogized to picking up a playing card from a felt table versus picking it up from a smooth glass table, or picking up a smooth plastic placard from an artificial turf surface versus picking it up from a smooth linoleum surface.

The use of a nanowire population as a MEMS standoff mechanism according to one or more of the embodiments can be advantageous over a simple surface "roughening" at least because a variety of different nanowire lengths, nanowire patch locations, and springabilities are offered and can be custom matched for a particular application, whereas the options for simple roughening are more limited. With regard to springability, it is believed unlikely that springability can be provided by simple roughened surfaces or, even if so, the amount of springability would be relatively crudely adjustable and not as readily tuned (e.g., by choice of nanowire length, material, orientation etc.) as nanowire standoff layers according to one or more of the embodiments.

The use of a nanowire population as a MEMS standoff mechanism according to one or more of the embodiments can be advantageous over the use of one or more large stand-off bumps/posts at least because a more distributed quality of standoff support can be provided (e.g., causing fewer surface strains in the contacting member(s)), along with the above-mentioned customizability and springability advantages. Embodiments in which the standoff nanowires comprise substantially nonconducting materials, such as SiC and high-bandgap dielectric materials, would be advantageous over embodiments based on carbon nanotubes because the latter are highly electrically conductive and, if they broke off from their locations, undesired electrical shorts in various portions of the MEMS device could occur, whereas nonconducting materials would not cause such shorts if they broke off.

Silicon is the material most commonly used to create the integrated circuits used in most consumer electronics in the modern world. Economies of scale, ready availability of inexpensive high-quality silicon materials, and the ability to incorporate electronic functionality also make silicon attractive for a wide variety of MEMS applications. Technologies built up around the use silicon materials include CMOS (complementary metal-oxide-semiconductor), bipolar, and BiCMOS (integration of bipolar and CMOS technologies), and associated silicon-based micromachining processes. Advantageously, fabricating nanowire standoff layers according to one or more of the embodiments is highly compatible with CMOS, bipolar, and/or BiCMOS processing such that the same set of reactor equipment can be used for fabricating both the nanowire standoff layers and the various surrounding MEMS structures. This can be advantageous over embodiments based on carbon nanotubes and having fabrication based on materials (such as iron or nickel) and/or process chemicals (such as acetylene-ammonia mixtures) that are generally incompatible with CMOS, bipolar, and/or BiCMOS processing.

Fabrication of MEMS devices according to one or more of the embodiments can be achieved using known fabrication methods including, but not limited to: deposition methods such as chemical vapor deposition (CVD), metal-organic CVD (MOCVD), plasma enhanced CVD (PECVD), chemical solution deposition (CSD), sol-gel based CSD, metal-organic decomposition (MOD), Langmuir-Blodgett (LB) techniques, thermal evaporation/molecular beam epitaxy (MBE), sputtering (DC, magnetron, RF), and pulsed laser deposition (PLD); lithographic methods such as optical lithography, extreme ultraviolet (EUV) lithography, x-ray lithography, electron beam lithography, focused ion beam (FIB) lithography, and nanoimprint lithography; removal methods such as wet etching (isotropic, anisotropic), dry etching, reactive ion etching (RIE), ion beam etching (IBE), reactive IBE (RIBE), chemical-assisted IBE (CAIBE), and chemical-mechanical polishing (CMP); modifying methods such as radiative treatment, thermal annealing, ion beam treatment, and mechanical modification; and assembly methods such as wafer bonding, surface mount, and other wiring and bonding methods.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, within the scope of the embodiments is a MEMS device having a large population of cells with closably-gapped members and nanowire standoff layers similar to at least one of the above-described embodiments, and being further designed such that the nanowires of different cells are patterned differently (e.g., different sections of the surfaces populated, different nanowire orientation strategies, etc.) or the nanowires of different cells are formed from different materials (e.g., conducting, insulating, diode-forming, etc.) for achieving different mechanical and/or electrical device goals. Thus, reference to the details of the described embodiments is not intended to limit their scope.

What is claimed is:

1. A MEMS device, comprising:
a first member having a first surface;
a second member having a second surface, said first and second surfaces being separated by a gap that is closable by a MEMS actuation force applied to at least one of said first and second members; and
a standoff layer disposed on said first surface of said first member, said standoff layer providing standoff between said first and second surfaces upon a closing of said gap by said MEMS actuation force;
wherein said standoff layer comprises a plurality of nanowires anchored to said first surface and extending outward therefrom.

2. The MEMS device of claim 1, wherein each of said plurality of nanowires comprises a material that is substantially nonconducting at a nominal operating voltage of the MEMS device.

3. The MEMS device of claim 2, wherein said nanowire material is selected from the group consisting of SiC and high-bandgap dielectric materials.

4. The MEMS device of claim 1, wherein said nanowires are disposed on said first surface according to a predetermined spatial pattern, and wherein each of said nanowires extends outward from said first surface at one of a plurality of predetermined angles nonparallel to said first surface.

5. The MEMS device of claim 1, wherein said nanowires are disposed on said first surface in a random spatial pattern.

6. The MEMS device of claim 1, wherein said nanowires extend outward from said first surface at random angles substantially nonparallel to said first surface.

7. The MEMS device of claim 1, said plurality of nanowires being a first plurality of nanowires, said MEMS device further comprising a second plurality of nanowires anchored to said second surface and extending outward therefrom.

8. The MEMS device of claim 1, said first surface comprising a semiconductor material, wherein said nanowires comprise a material that can be catalytically grown from said first surface according to a CMOS compatible process.

9. The MEMS device of claim 8, wherein said nanowire material is selected from the group consisting of Si, Ge, SiC, Group III-V materials, and Group II-VI materials.

10. The MEMS device of claim 1, wherein each of said first and second members including said first and second surfaces are electrically conductive, and wherein each of said nanowires comprises p-doped material at a first end and n-doped material at a second end to form a diode.

11. A method of fabricating a MEMS device, comprising:
forming a first member having a first surface and a second member having a second surface, said first and second surfaces being separated by a gap that is closable by a MEMS actuation force applied to at least one of said first and second members; and
growing a plurality of nanowires anchored to said first surface and growing outward therefrom, whereby said plurality of nanowires form a standoff layer providing standoff between said first and second surfaces upon a closing of said gap by said MEMS actuation force.

12. The method of claim 11, further comprising forming a predetermined pattern of metallic islands on said first surface, wherein said growing the plurality of nanowires comprises catalytically growing the plurality of nanowires from said first surface at locations corresponding to said metallic islands.

13. The method of claim 12, wherein said forming said first and second members comprises:
prior to said forming the predetermined pattern, forming said first member in a first layer;
subsequent to said forming the predetermined pattern, forming a second layer above said first layer and said metallic islands, wherein said second layer is a sacrificial layer;
forming said second member in a third layer above said second layer such that at least a portion of said second layer is exposed; and
prior to said catalytically growing said plurality of nanowires, removing said second layer to expose said metallic islands.

14. The method of claim 11, further comprising:
subsequent to said forming said first and second members including said gap therebetween, filling said gap with a colloidal solution containing metallic nanoparticles; and
drying said colloidal solution, whereby a first plurality of said metallic nanoparticles from said colloidal solution remain on said first surface at a first plurality of random locations;
wherein said growing the plurality of nanowires comprises catalytically growing said nanowires at said first plurality of random locations.

15. The method of claim 14, said plurality of nanowires being a first plurality of nanowires, said drying said colloidal solution further resulting in a second plurality of metallic nanoparticles remaining on said second surface at a second plurality of random locations, the method further comprising catalytically growing a second plurality of nanowires extending outward from said second surface at said second plurality of random locations.

16. The method of claim 14, wherein said first member comprises a uniform crystalline structure at said first surface thereof, whereby each of said nanowires grows outward from said first surface at one of a plurality of predetermined angles substantially nonparallel to said first surface.

17. The method of claim 14, wherein said first member comprises a polycrystalline structure at said first surface thereof, whereby said nanowires grow outward from said first surface at random angles.

18. A method comprising operating a MEMS device to cause a mechanical closing of a gap between a first surface of a first member of the MEMS device and a second surface of a second member of the MEMS device, wherein at least said first surface comprises a plurality of nanowires anchored thereto and extending outward therefrom to form a standoff layer that provides standoff between said first and second surfaces upon said closing of said gap.

19. The method of claim 18, wherein said nanowires are disposed on said first surface according to a predetermined spatial pattern, and wherein each of said nanowires extends outward from said first surface at one of a plurality of predetermined angles substantially nonparallel to said first surface.

20. The method of claim 19, wherein said nanowires are disposed on said first surface in a random spatial pattern.

* * * * *

UNITED STATES PATENT AND TRADEMARK OFFICE
CERTIFICATE OF CORRECTION

PATENT NO. : 7,477,441 B1  Page 1 of 1
APPLICATION NO. : 11/881076
DATED : January 13, 2009
INVENTOR(S) : Wenhua Zhang et al.

It is certified that error appears in the above-identified patent and that said Letters Patent is hereby corrected as shown below:

In column 4, line 42, after "about" insert -- 5 --.

Signed and Sealed this

Twenty-first Day of July, 2009

JOHN DOLL
*Acting Director of the United States Patent and Trademark Office*